(12) United States Patent
Soma

(10) Patent No.: US 11,670,693 B2
(45) Date of Patent: Jun. 6, 2023

(54) TRENCH GATE FIELD-EFFECT TRANSISTORS WITH DRAIN RUNNER

(71) Applicant: SEMICONDUCTOR COMPONENTS INDUSTRIES, LLC, Phoenix, AZ (US)

(72) Inventor: Mitsuru Soma, Higashimatsuyama (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 55 days.

(21) Appl. No.: 17/248,512

(22) Filed: Jan. 28, 2021

(65) Prior Publication Data

US 2022/0238664 A1 Jul. 28, 2022

(51) Int. Cl.
*H01L 29/417* (2006.01)
*H01L 29/40* (2006.01)
*H01L 29/66* (2006.01)
*H01L 21/265* (2006.01)
*H01L 21/765* (2006.01)
*H01L 29/78* (2006.01)

(52) U.S. Cl.
CPC .. *H01L 29/41741* (2013.01); *H01L 21/26513* (2013.01); *H01L 21/765* (2013.01); *H01L 29/407* (2013.01); *H01L 29/66734* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 2004/0065919 | A1 | 4/2004 | Wilson et al. |
| 2008/0142883 | A1 | 6/2008 | Grebs et al. |
| 2009/0278200 | A1* | 11/2009 | Takeda ............... H01L 29/7813 257/E21.135 |
| 2011/0079843 | A1* | 4/2011 | Darwish ............. H01L 29/7813 257/E29.257 |

* cited by examiner

*Primary Examiner* — Vincent Wall
(74) *Attorney, Agent, or Firm* — Brake Hughes Bellermann LLP

(57) ABSTRACT

In a general aspect, a field-effect transistor (FET) can include a semiconductor region, and a trench disposed in the semiconductor region. The FET can also include a trench gate disposed in an upper portion of the trench in an active region of the FET. The FET can further include a conductive runner disposed in a bottom portion of the trench. The conductive runner can be electrically coupled with a drain terminal of the FET. A portion of the conductive runner can be disposed in the active region below the trench gate.

20 Claims, 15 Drawing Sheets

TRENCH GATE FIELD-EFFECT TRANSISTORS WITH DRAIN RUNNER

TECHNICAL FIELD

This description relates to power transistors. More specifically, this disclosure relates to trench gate field-effect transistors that include a metal drain runner.

BACKGROUND

Power transistors (e.g., operating at 20 volts, or higher), such as power metal-oxide-semiconductor field-effect transistors (MOSFETs) are used in a number of applications. For instance, these applications can include automotive applications, use in power converters, industrial applications, consumer electronic applications, and so forth. In some applications, such as direct current to direct current (DC-DC) power converters, multiple power MOSFETs, e.g., one as a high-side device and one as a low-side device, are integrated in a single semiconductor device (single semiconductor die).

For purposes of integration of high-side and low-side devices with each other on a single semiconductor device (e.g., due to top die drain location), as well as integration with control circuits (e.g., complimentary MOS (CMOS) circuits), bipolar devices, diodes, isolation structures, etc., current implementations implement such high-side and low-side power MOSFETs as laterally-diffused metal-oxide semiconductor (LDMOS) field-effect transistors (FETs), such as using two series-connected n-type LDMOS (NLD-MOS) FETs (e.g., where a source terminal of high-side NLDMOS FET is coupled with a drain terminal of a low-side NLDMOS FET). However, due to the lateral (planar) arrangement of such devices (e.g., laterally extending source, channel, drain and drift regions), scaling, or size reduction opportunities for such devices are limited, even with advances in corresponding semiconductor process technologies, and associated reductions in semiconductor device feature dimensions.

Further, other FET implementations also have drawbacks for implementation in such monolithic DC-DC converter applications. For instance, trench-gate FETs with top side drain access (contacts) can have insufficient two-dimensional electric field modulation for implementation as high-side and low-side power devices in DC-DC converter, and can also have on-resistances (e.g., drain terminal interconnection structures, such as buried diffusion layers) that can impact performance as integrated devices in such DC-DC converter applications. Further, shielded-gate trench FETs (e.g., superjunction devices) can be difficult to monolithically integrate (in a single semiconductor device) as high-side and low-side devices for a DC-DC converter due to their implementations using backside (substrate) drain terminals. For instance, such implementations would then include complicated isolation and interconnection structures between the high-side device and the low-side device, which can also impact performance (e.g., increase resistance, increase parasitic impedance, etc.) of the corresponding DC-DC converter.

SUMMARY

In a general aspect, a field-effect transistor (FET) can include a semiconductor region, and a trench disposed in the semiconductor region. The FET can also include a trench gate disposed in an upper portion of the trench in an active region of the FET. The FET can further include a conductive runner disposed in a bottom portion of the trench. The conductive runner can be electrically coupled with a drain terminal of the FET. A portion of the conductive runner can be disposed in the active region below the trench gate.

Figure 1A:
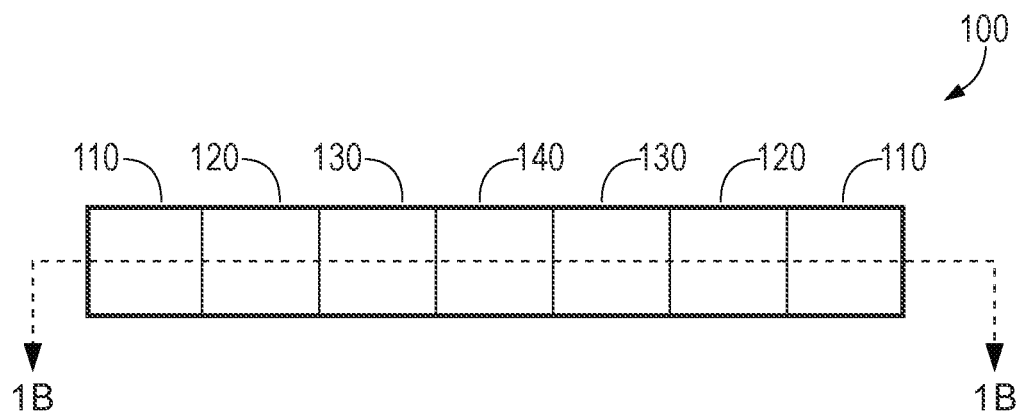
FIG. 1A is a block diagram that schematically illustrates a trench gate field effect transistor (FET).

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated in a given view.

DETAILED DESCRIPTION

The present disclosure is directed to trench gate field effect transistors (FETs) that can address at least some of the drawbacks noted above. For instance, this disclosure is directed to power trench FETs that include a conductive drain runner disposed in a trench (e.g., in a gate trench) of the FET. Implementations of such FETs can have low on resistance (due to low drain resistance attributed to the drain runner). Such trench-gate FETs can also have front side drain contact access, such that they can be readily integrated (e.g., monolithically on a single semiconductor die) as high-side and low-side devices of a DC-DC converter. In some implementations, a conductive drain runner can be electrically connected to front (top) side metal interconnects, e.g., using a heavily doped (n+ doped) sinker and/or using a deep metal contact (e.g., a tungsten plug).

Such conductive drain runners (which can be metal and/or metal-silicide) can, in some implementations, be formed on drain silicon (e.g., a lightly doped n-type drain silicon portion), and can have much lower resistance than buried layers used for top-side drain connections in current trench FET devices. For example, in some implementations, a conductive drain runner can be located at in a bottom portion of a trench of the trench-gate FET, e.g., above a junction isolation well, which can provide isolation between monolithically integrated high-side and low-side power FETs. In such implementations, complex isolation structures can be avoided, because the drain terminals of the power FETs are not included in an underlying (e.g., heavily doped) substrate. That is, drain terminals of the example FETs described herein are not present at (on, etc.) a backside of a wafer in which the FETs are produced.

In some implementations, a gate electrode of a trench-gate FET can include a sidewall spacer, such as a gate polysilicon electrode. As described herein, such implementations can simplify semiconductor processing operations used to produce a conductive drain runner. Use of such gate electrode polysilicon spacers, as illustrated herein, can define, at least in part, trench openings inside trench that are filled sacrificial material (such as SiN). In subsequent processing operations, that sacrificial material can be selectively removed (e.g., selective to the gate polysilicon spacer and/or shield oxide). This allows for efficient formation of the conductive (e.g., metal) material in the trench that is used for defining a drain runner, such as descried herein. Further, in some implementations, a metal and/or metal-silicide gate electrode can be used in combination with the gate polysilicon electrode (sidewall spacer), which can reduce resistance of the trench gate as compared to using only a polysilicon gate electrode.

The example implementations of trench-gate FETs described herein can also improve two-dimensional field modulation, which can improve tradeoffs between on resistance and breakdown voltage. For instance, in some implementations, a trench-gate FET can include a thick trench sidewall dielectric (shield dielectric, shield oxide, etc.) in a lower portion of the trench (e.g., where the drain runner is disposed within the shield dielectric). Such approaches can also reduce gate to drain capacitance of the trench-gate FET, which can improve performance for such power FETs (e.g., by reducing gate to drain charge) when used in high-frequency switching applications. Additionally, in some implementations, two-dimensional field modulation can also be improved by implementing a superjunction structure (e.g., alternating n-type and p-type pillars).

The example trench-gate FET implementations described herein can be used to implement monolithic DC-DC converter devices (e.g., as high-side and low-side power FETs), due to their vertical arrangement and operation, can reduce die size, as compared to use of NLDMOS devices, and can also allow for integration of other types of circuit elements, e.g., bipolar devices, CMOS device, HVMOS devices, diodes, etc., on single semiconductor die (e.g., using a same semiconductor manufacturing process).

Figure 1B:
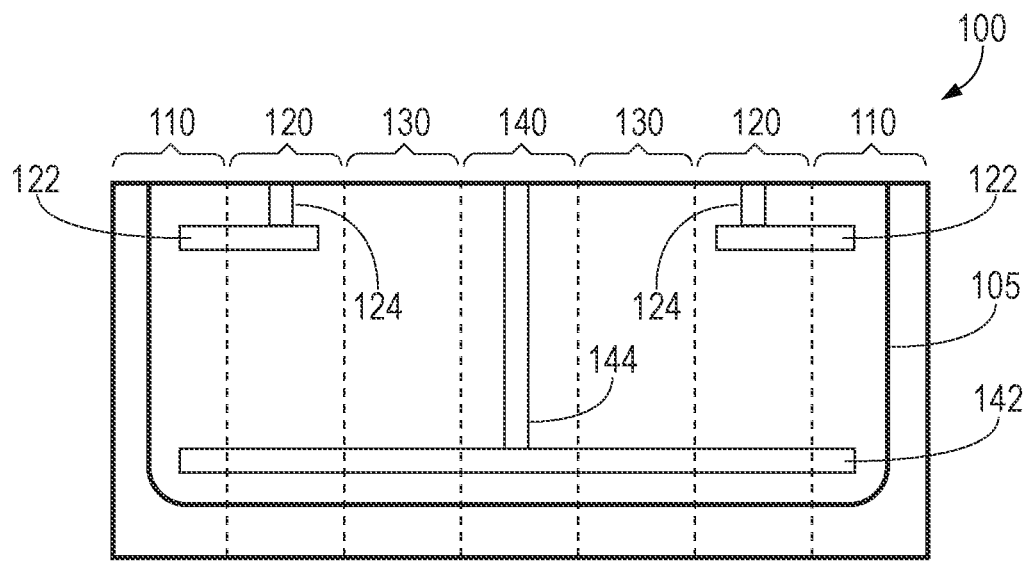
FIG. 1B is a block diagram that schematically a side view of the trench-gate FET of FIG. 1A.

FIG. 1A is a block diagram that schematically illustrates a trench-gate field-effect transistor (trench-gate FET 100). FIG. 1B is a block diagram that schematically illustrates a side view cross-sectional view of the trench-gate FET 100 of FIG. 1A along a section line 1B-1B. In the example of FIGS. 1A and 1B, certain elements of the trench-gate FET 100 are shown for purposes of illustration. Example implementations of such FETs including further details of a trench-gate FET are described below with respect to FIGS. 2-15. FIGS. 1A and 1B, for purposes of illustration, will be described together.

As can be seen in FIGS. 1A and 1B, the trench-gate FET 100 can include a number of regions (e.g., implemented in a semiconductor region). In this example, the regions of the trench-gate FET 100 include an active region 110, a gate contact region 120, an isolation region 130 and a drain contact region 140. In this example, the trench-gate FET 100 can have a mirrored arrangement. That is, the trench-gate FET 100, the active region 110, the gate contact region 120, and the isolation region 130 are mirrored on both sides of the drain contact region 140. In some implementations, other arrangements are possible. For instance, a trench-gate FET could include only a single active region 110, a single gate contact region 120, and a single isolation region 130 in conjunction with the drain contact region 140.

As shown in FIG. 1B (which, as noted above, corresponds with the section line 1B-1B in FIG. 1A), the trench-gate FET 100 can include a trench 105 that extends (in a semiconductor region of the trench-gate FET 100) from the active region 110 on the left side of FIG. 1B to the active region 110 on the right side of FIG. 1B. The trench-gate FET 100, as schematically illustrated in FIG. 1B, includes a trench-gate electrode 122 (mirrored on the left and right sides of the trench-gate FET 100, as first and second trench-gate electrodes). The trench-gate electrode 122, as shown in FIG. 1B, is disposed in the active region 110 and the gate contact region 120, and is contacted, in the gate contact region 120, by a gate contact 124. The gate contact 124 of the trench-gate FET 100 extends from an upper surface of the semiconductor region to the trench-gate electrode 122 (e.g., forming an ohmic contact with the trench-gate electrode 122). In some implementations, the gate contact 124 can include metal (e.g., tungsten, copper, cobalt, etc.), and/or metal-silicide, or can include other conductive materials, such as heavily doped sinkers. Example implementations of the trench-gate electrode 122 are described herein.

As shown in FIG. 1B, the trench-gate FET 100 also includes a conductive drain runner 142, which is disposed in a bottom portion of the trench 105. For purposes of illustration, the conductive drain runner 142 is shown in FIG. 1B as being spaced from a bottom surface of the trench 105. In some implementations, such as those described herein, the conductive drain runner 142 can be disposed on a bottom surface of the trench (e.g., such that the conductive drain runner 142 is in contact with a heavily-doped drain implant disposed in the semiconductor region below the trench 105). As shown in FIG. 1B, the conductive drain runner 142 can, in this example, extend from the active region 110 on the left side of the trench-gate FET 100 to the active region 110 on right side of the trench-gate FET 100, and extend through the other regions of the trench-gate FET 100 (e.g., the gate contact region(s) 120, the isolation region(s) 130, and the drain contact region 140).

As is also shown in FIG. 1B, the conductive drain runner 142 is contacted, in the drain contact region 140, by a drain contact 144. As shown in FIG. 1B, the drain contact 144 of trench-gate FET 100 extends from an upper surface of the semiconductor region of the trench-gate FET 100 to the conductive drain runner 142. In some implementations, the drain contact 144 can include one or more of a metal (e.g., tungsten, copper, cobalt, etc.), a metal-silicide, a heavily doped (e.g., n+doped) sinker, and so forth. Examples of the conductive drain runner 142 are described herein.

Figure 2:
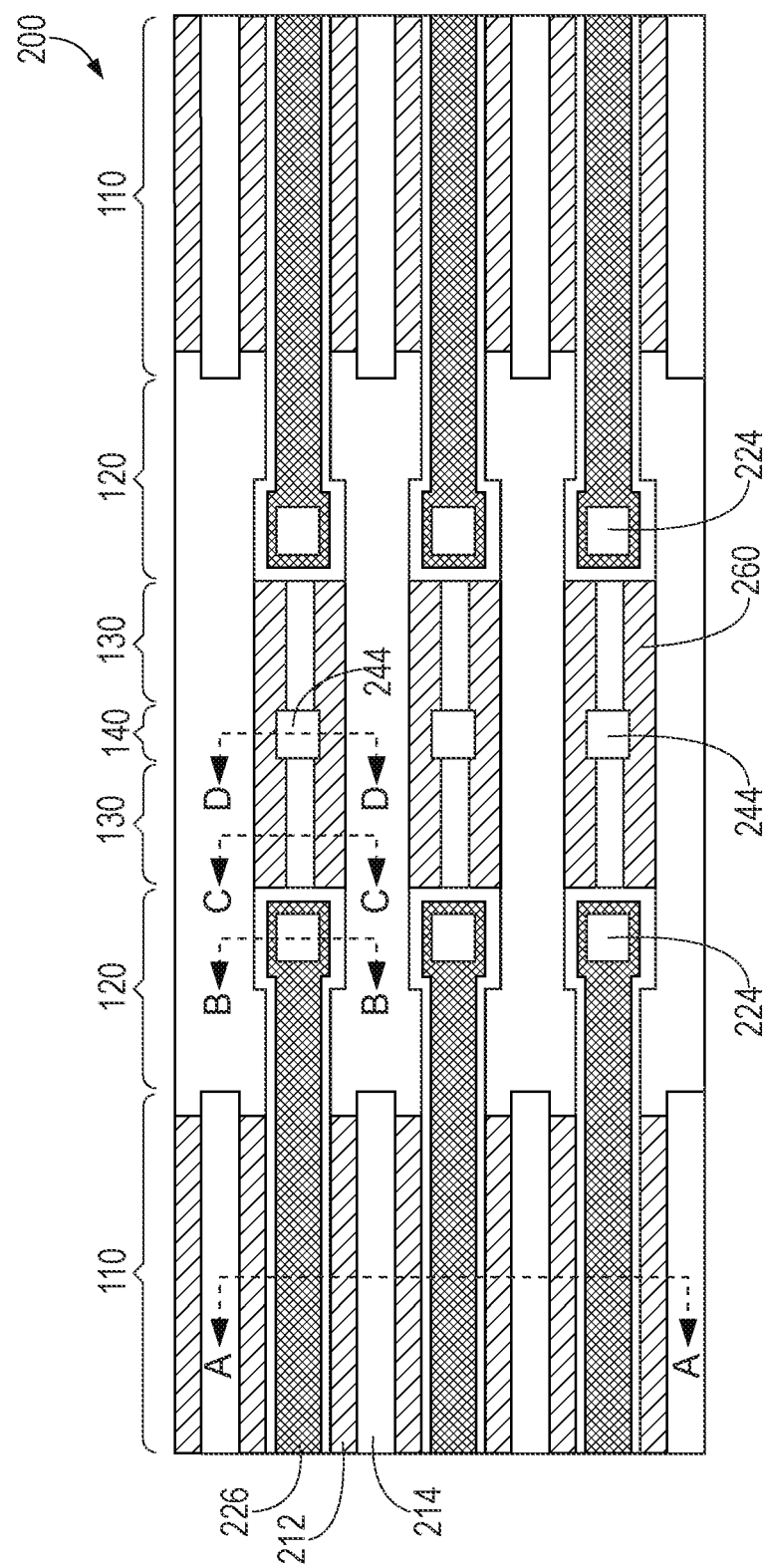
FIG. 2 is a diagram illustrating a plan (top) view of a trench-gate FET.

FIG. 2 is a diagram illustrating a plan (top) view of a trench-gate FET 200, which can implement the trench-gate FET 100 of FIGS. 1A and 1B. For purposes of illustration, FIG. 2 indicates the same regions for the trench-gate FET 200 as the trench-gate FET 100 shown in FIGS. 1A and 1B (e.g., active regions, gate contact regions, isolation regions, and drain contact region). Each of these regions of the trench-gate FET 200 is briefly described below. Also, for purposes of illustrations, the trench-gate FET 200 of FIG. 2 is illustrated without top-side metallization, so as not to obscure the underlying structure. Still further, the trench-gate FET 200 shown in FIG. 2 can be a cell, or portion, of a corresponding trench-gate FET. That is, the trench-gate FET 200 shown in FIG. 2 can be used as a building block to produce larger trench-gate FET devices.

Referring to FIG. 2, the trench-gate FET 200, in the active region 110, includes source regions 212 and source/body contacts 214. The active region 110 also include trench-gate electrodes 226 (which extend from the gate contact region 120 into the active region 110). A section line A-A is shown in FIG. 2, where the section line corresponds with the active region 110 cross-sectional views shown in FIG. 3-15.

The gate contact region 120 of the trench-gate FET 200 includes gate contacts 224 (corresponding with the gate contact 124 of the trench-gate FET 100). A section line B-B is shown in the gate contact region 120 of the trench-gate FET 200, where the section line B-B corresponds with the cross-sectional views of the gate contact region 120 shown in FIGS. 4-15. A section line C-C is shown in the isolation region 130 of the trench-gate FET 200, where the isolation region 130 electrically isolates (insulates, etc.) the gate contacts 224 from a drain contact 244 disposed in the drain contact region 140 of the trench-gate FET 200. The section line B-B corresponds with the cross-sectional views of the isolation region 130 shown in FIGS. 4-15. Further, a section line C-C is shown in the drain contact region 140 of the trench-gate FET 200 in FIG. 2, where the section line C-C corresponds with the cross-sectional views of the drain contact region 140 shown in FIGS. 4-15. Also shown in FIG. 2, the trench-gate FET 200 can include a dielectric 260 (e.g., an inter-layer dielectric) through which the gate contacts 224 and the drain contact 244 can be formed, such as shown by the semiconductor process illustrated in FIGS. 4-15.

Figure 3:
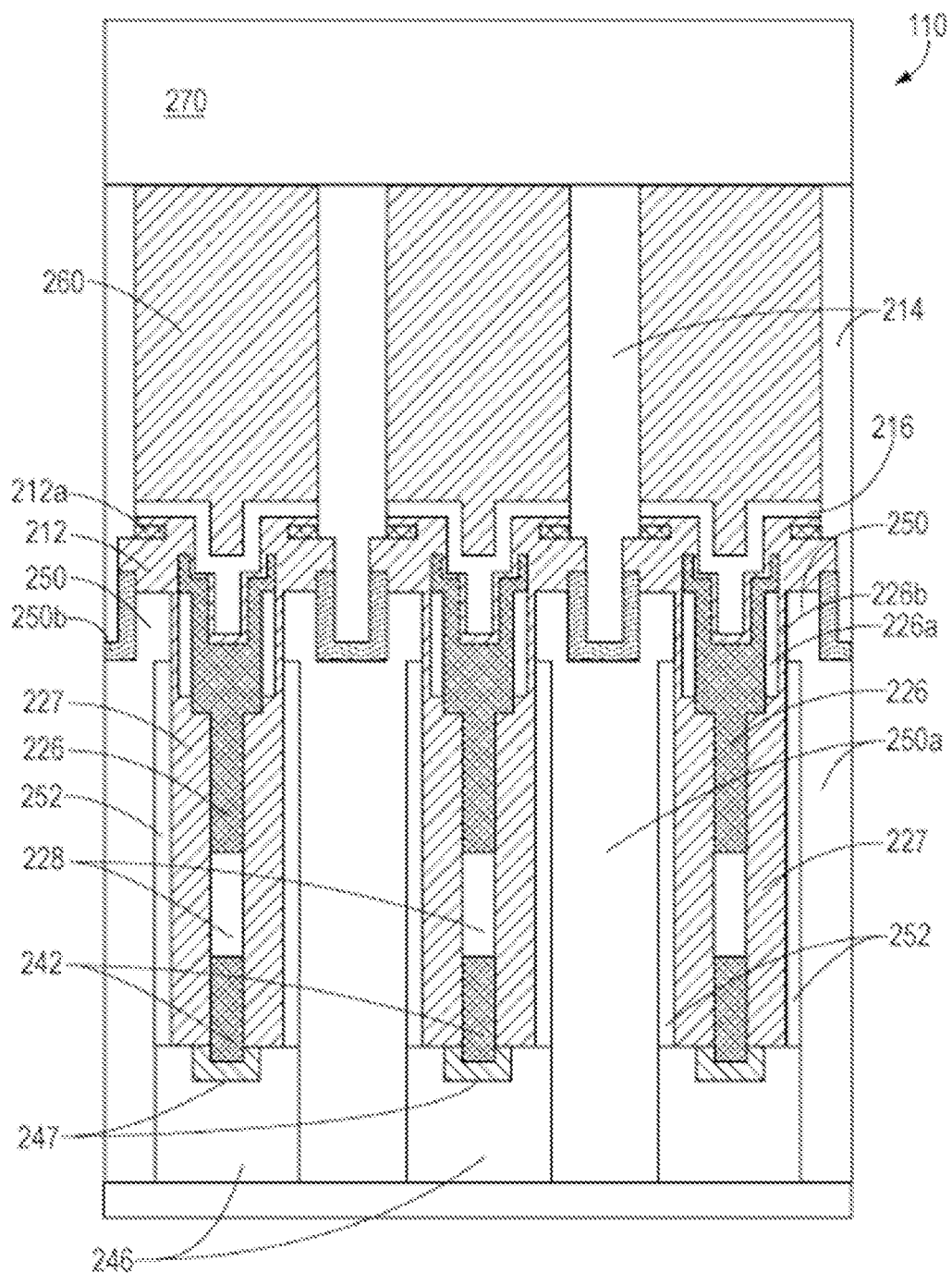
FIG. 3 is a diagram illustrating a cross-sectional view of an active region of the trench-gate FET of FIG. 2.

FIG. 3 is a diagram illustrating a cross-sectional view of the active region 110 of the trench-gate FET 200 of FIG. 2. The elements of the active region 110 of the trench-gate FET 200 are discussed with respect to FIG. 3, and further discussed with respect to an associated semiconductor manufacturing process illustrated by FIGS. 4-15. In the following discussion, the elements of the active region 110 of the trench-gate FET 200 shown in FIG. 3 will described, generally, starting from the bottom of the page and moving towards the top of the page. For purposes of reference with the manufacturing process of FIGS. 4-15, the active region 110 illustrated in FIG. 3 corresponds with the active region 110 illustrated in FIG. 15. The example implementations included herein are, for purposes of illustration, described with reference to specific elements have specific doping types (e.g., n-type or p-type). In some implementations, these doping types can be reversed from the those described herein (e.g., to implement a p-channel device, rather than an n-channel device).

Referring to the FIG. 3, the active region 110 can include lightly-doped drain regions 246, which can be defined from a well region, such as an n-type well region 402b, as shown in FIGS. 4-15. In some implementations, the active region 110 of FIG. 3 can be disposed on additional semiconductor regions (e.g., which can provide junction isolation between monolithically integrated trench-gate FETs, such as in a DC-DC converter). For instance, such additional semiconductor regions can include various semiconductor regions, e.g., a deep n-type well region 402a, an n-type well region 402b, and a deep p-type well region 404, as shown in FIGS. 4-15. As shown in FIG. 2, heavily doped drain implants 247 (n-type implants) can be disposed in the lightly-doped drain regions 246 (e.g., at the bottom of trenches of the trench-gate FET 200). The heavily doped drain implants 247 can allow for (facilitate, etc.) the formation of low-resistance (e.g., ohmic) contacts with a conductive drain runner 242 that is disposed in a bottom portion of the trenches of the trench-gate FET 200.

As shown in FIG. 3, the trenches of the active region 110 of the trench-gate FET 200 can have a shield dielectric 227 (thick dielectric) disposed therein (e.g., on at least first and second opposing sidewalls of the trenches), which can improve two-dimensional field modulation over current trench FET implementations. The trenches, as shown in FIG. 3, can further have an insulating layer 228 (dielectric layer) disposed on the conductive drain runner 242, and a trench-gate electrode 226 (e.g., metal trench-gate electrode) disposed on the insulating layer 228. As also illustrated in FIG. 3, the trench-gate FET 200 can include p-type pillars 250a that alternate with n-type regions (e.g., n-type pillars 252) to form a charge-balance (e.g., superjunction) structure for the active region 110.

The trench-gate FET 200 can further include, in its trenches, gate electrode sidewall spacers 226a, that are in contact with (e.g., in electrical and/or direct contact with) the trench-gate electrodes 226 (e.g., metal trench-gate electrodes). In some implementations, the gate electrode sidewall spacers 226a can include a doped (n-type) polysilicon material. The trench-gate structure of the trench-gate FET 200, in addition to the trench-gate electrodes 226 and the gate electrode sidewall spacers 226a, can include gate dielectric layers 226b, which can be disposed on sidewalls of the trenches, and in contact with (e.g., direct contact with) source regions 212 of the trench-gate FET 200 (e.g., between the gate electrode sidewall spacers 226a and the source regions 212).

As shown in FIG. 3, the source regions 212 can include a metal-silicide 212a disposed (formed, etc.) thereon, which can be a cobalt silicide, titanium silicide, etc. The metal-silicide 212a can facilitate formation of ohmic contacts with the source regions 212. The FET The trench-gate FET 200 can also include, in the p-type pillars 250a, heavily doped body implants 250b (e.g., heavily doped p-type regions), which can facilitate formation of ohmic contacts with the p-type pillars 250a (which are disposed below p-type body regions 250 of the trench-gate FET 200).

The trench-gate FET 200, as shown in FIG. 3, also includes a contact etch stop layer (a CESL 216), which can be formed from, in some implementations, silicon nitride (SiN). The CESL 216 can provide (act as, etc.) an etch stop layer for formation of the source/body contacts 214, such as in the semiconductor process of FIGS. 4-15. The active region 110, as shown in FIG. 3, also include the dielectric 260, which forms an interlayer dielectric layer between a source/body signal metal layer 270 and the underlying structure of the active region 110 of the trench-gate FET 200. In such implementations, the source/body contacts 214 can provide respective electrical connections from the source/body signal metal layer 270 to the source regions 212, the metal-silicide 212a and the heavily doped body implants 250b (e.g., heavily doped p-type body regions).

FIG. 4-15 are cross-sectional diagrams that illustrate a process for producing a trench-gate FET, such as the trench-gate FET of FIGS. 2 and 3. That is, in FIGS. 4-15, an example implementation of the trench-gate FET 200 is shown at various points in the illustrated semiconductor process. In FIGS. 4-15, respective cross-sectional views for the active region 110, the gate contact region 120, the isolation region 130, and the drain contact region 140 of an implementation of the trench-gate FET 200 are shown. In other words, respective cross-sectional view (at the various points in the illustrated process) corresponding with the section lines A-A, B-B, C-C and D-D of FIG. 2 are shown in each of FIGS. 4-15. It is noted that, in the FIGS. 4-15, as indicated by the section lines in the FIG. 2, three trenches are illustrated for the active region 110, while only a single trench is illustrated for the gate contact region 120, the isolation region 130 and the drain contact region 140.

Also, for purposes of brevity, not all processing steps are specifically illustrated or described in detail in FIGS. 4-15.

For instance, multiple semiconductor processing operations can be illustrated by each figure of FIGS. 4-15. For example, photolithography masks (e.g., photoresist masks, hard masks using SiN or oxide, etc.) that are produced using (or based on) the respective photolithography masks may not be shown. Instead, the structures resulting from use of such masking layers and associated processing operation may be illustrated, where such associated processing operations can include one or more of photolithography operations, oxidation operations, deposition operations, implant operations, diffusion operations, etch operations, polish operations, and so forth.

Further, the example semiconductor manufacturing process of FIGS. 4-15 can also be used to produce other devices that are integrated with the example implementation of the trench-gate FET 200 that is illustrated. For instance, the process of FIGS. 4-15 can also produce bipolar devices, CMOS device, diodes, etc. However, for purposes of brevity and clarity, the specifics of such additional devices are not shown herein. However, in the discussion of FIGS. 4-15, reference is made to processing operations that can be included for producing CMOS devices that are integrated with the example trench-gate FET 200. Also, the order of processing operations discussed with respect to FIGS. 4-15 is given by way of example. In some implementations, semiconductor processing operations can be performed in other orders, one or more processing operations can be added or omitted, etc.

Figure 4:
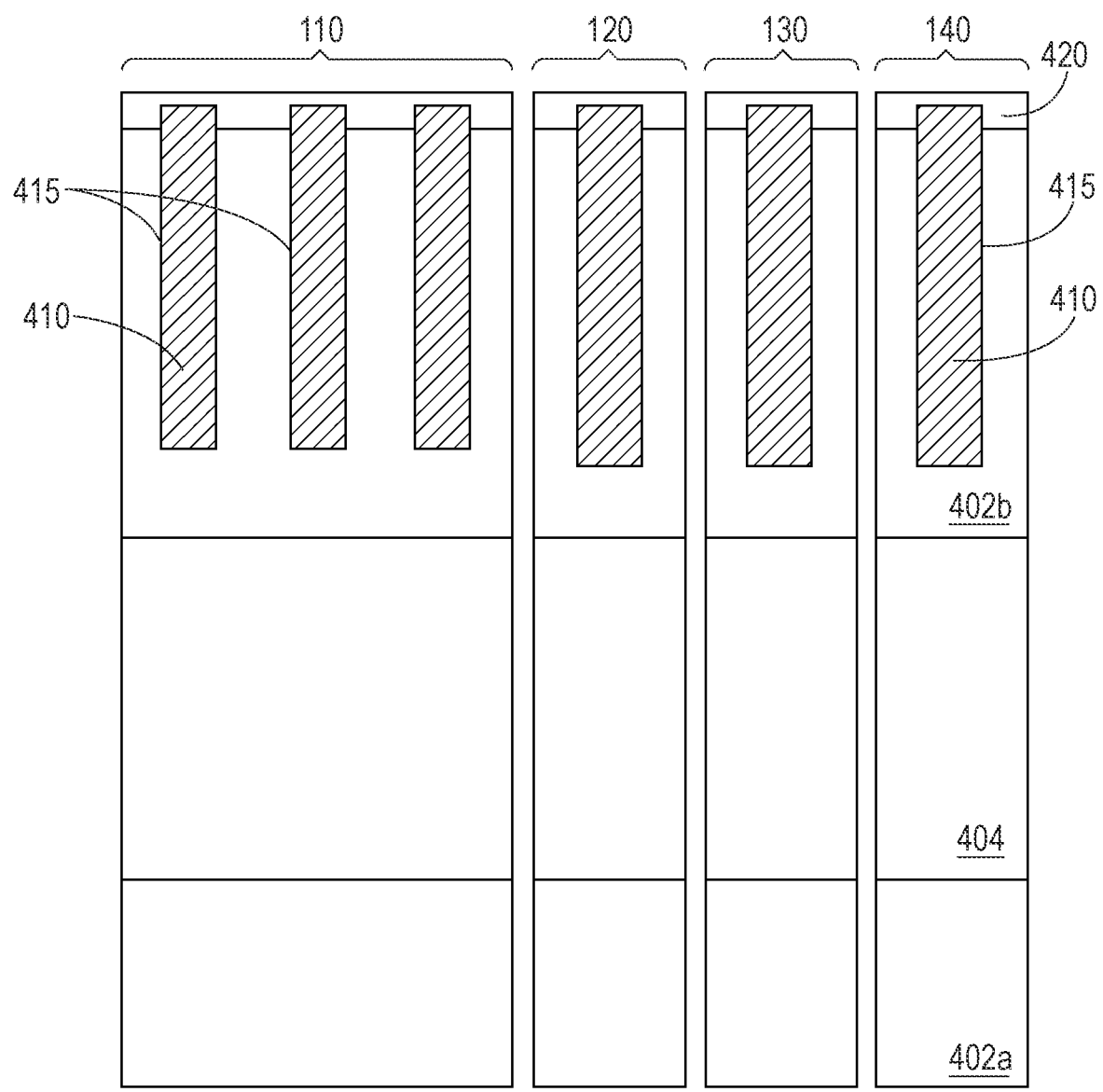
FIG. 4-15 are cross-sectional diagrams that illustrate a process for producing a trench-gate FET, such as the trench-gate FET of FIGS. 2 and 3.

Referring to FIG. 4, in this example, producing a trench-gate FET, such as the trench-gate FET 200, that is integrated with CMOS devices (which, as noted above, are not specifically shown in FIGS. 4-15), can be done starting with a p-type semiconductor substrate. As shown in FIG. 4, a buffer layer 420 can be formed, where the buffer layer 420 can protect a surface of the substrate during processing. In some implementations, the buffer layer 420 can include oxide and/or SiN. In some implementations, the buffer layer 420 can be formed over an entire surface of the substrate.

After forming the buffer layer 420, photolithography and etch operations can be performed to form trenches 415 in the substrate, which are then used as trenches (e.g., trench 105) of the example trench-gate FET 200 described herein. Trenches 415 can also be formed in a corresponding CMOS device region, where these trenches can be used as isolation trenches between n-channel and p-channel CMOS transistors. Dielectric 410 can then be formed in the trenches 415, which can include thermal oxide, plasma deposited oxide, etc. The dielectric 410 can then be planarized (e.g., polished, etc.), and additional material can be added to the buffer layer 420 to protect the dielectric 410.

Subsequent to the operations discussed above, in this example, a CMOS device area can be masked (e.g., with photoresist) to block/protect the CMOS area from a set of subsequent processing operations. For instance, after blocking the CMOS area, implant operations can be performed to form the various semiconductor regions (e.g., well regions) shown in FIG. 4. For instance, an n-implant (or implants) can be performed to form the deep n-type well region 402a, and the n-type well region 402b. Also, a p-type implant can be performed to form the deep p-type well region 404. As noted above, the arrangement of the deep n-type well region 402a, the n-type well region 402b and the deep p-type well region 404 can provide junction isolation (e.g., drain isolation) between monolithically integrated trench-gate FETs, such as respective implementations of the trench-gate FET 200 as a high-side FET and a low-side FET in a DC-DC converter.

Figure 5:
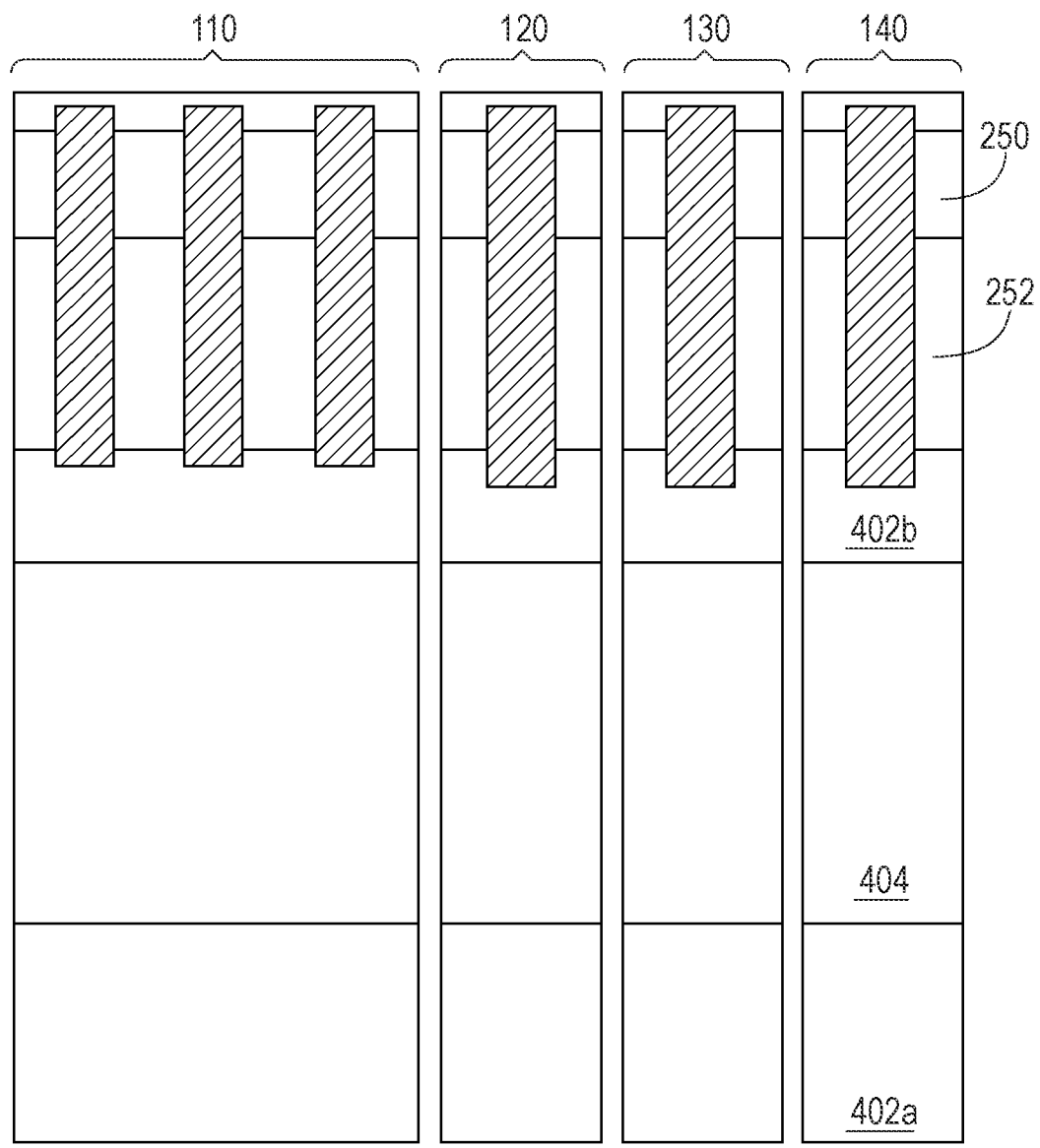
Figure 6:
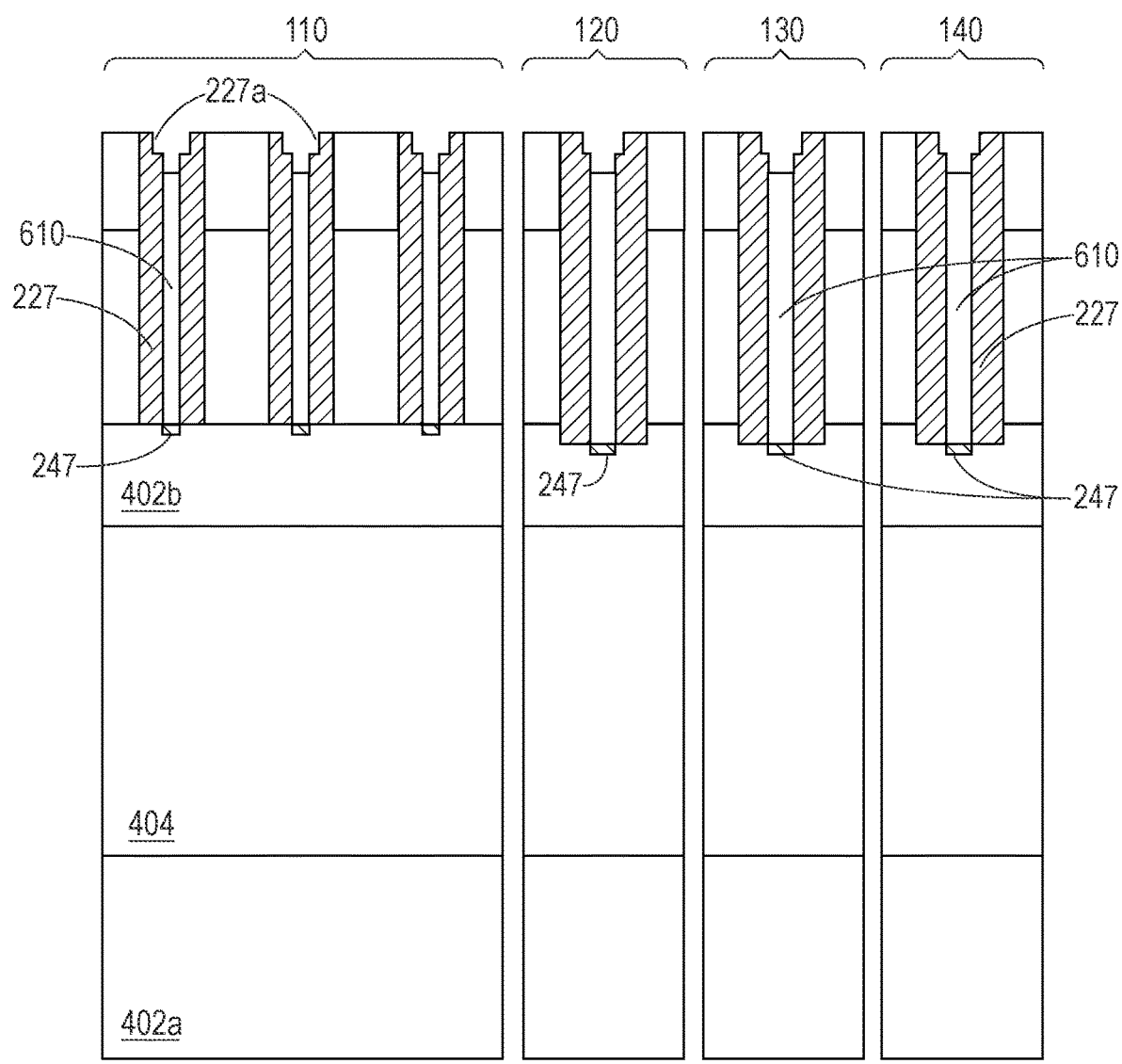

Referring first to FIG. 5 and then to FIG. 6, with the CMOS device area still masked, respective implant operations can be used to form (define, etc.) the n-type pillars 252 and the p-type body regions 250 in the n-type well region 402b, such as illustrated in FIG. 5. Referring to FIG. 6, after forming the p-type body regions 250 and the n-type pillars 252, the buffer layer 420 can be partially removed in the area of the trench-gate FET 200 (e.g., in the active region 110, the gate contact region 120, the isolation region 130, and the drain contact region 140) to expose the dielectric 410. In this example, the buffer layer 420 can remain unetched in the protected (masked) CMOS device area. A dielectric (e.g., oxide) etch with a selectivity to the material (e.g., SiN) of the buffer layer 420 can then be performed to remove the dielectric 410 from the trenches 415 in the regions of the trench-gate FET 200.

Figure 7:
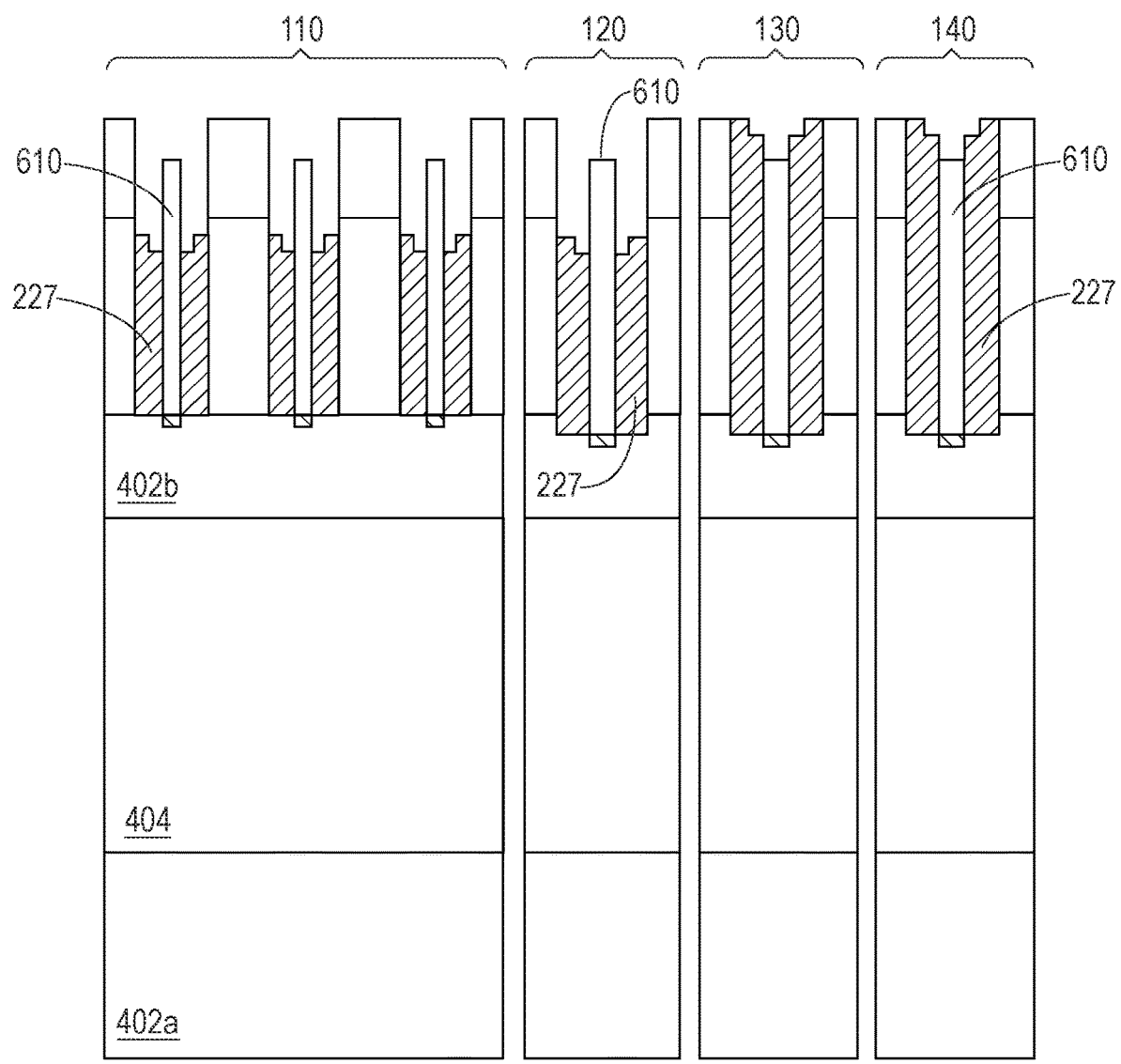

Still referring to FIG. 6, after removing the dielectric 410 from the trenches 415 of the trench-gate FET 200, the shield dielectric 227 can be formed in the trenches 415, and an oxide etch back operation can be used form notches 227a that will, after the process operations corresponding with FIG. 7, define corresponding notches (e.g., steps, etc.) for formation of gate electrode sidewall spacers 226a of the trench-gate FET 200. After forming the shield dielectric 227, an implant (n-type implant) can be performed (through an opening in the shield dielectric 227 to define the heavily doped drain implants 247 in the deep n-type well region 402a at the bottom of the trenches 415. As also illustrated in FIG. 6, after forming the heavily doped drain implants 247, the example process can include forming protective cores (e.g., SiN cores 610), which can act as a masking and/or protection layer for subsequent processing operations.

Referring to FIG. 7, after forming the SiN cores 610, the example process can include performing an etch operation (e.g., including photomasking and an oxide wet etch) to partially etch back the shield dielectric 227 in the active region 110, and the gate contact region 120 (e.g., for formation of the gate electrode structure of the trench-gate FET 200). As shown in FIG. 7, the dielectric 227 in the isolation region 130, and the drain contact region 140, in this example, is not etched back (e.g., is masked from the etch). After the operations corresponding with FIG. 7, the CMOS region may be uncovered (e.g., photoresist and/or any remaining buffer layer 420 can be removed), and the example process can proceed to the operations corresponding with FIG. 8.

Figure 8:
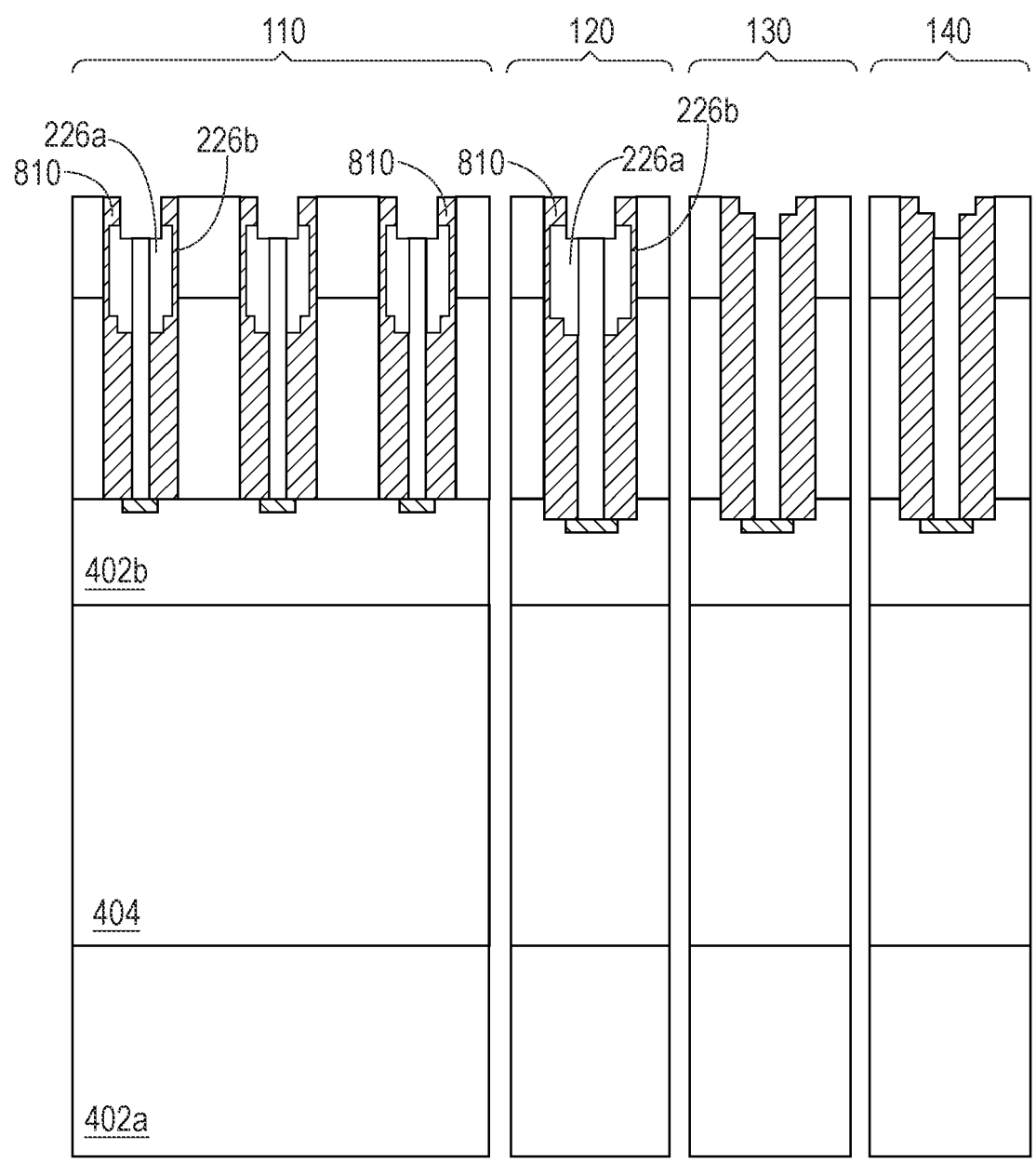

Referring to FIG. 8, in this example, subsequent to the process operations discussed above, operations to form gate dielectric layers 226b (gate oxide) for the trench-gate FET 200, as well as gate dielectric layers for CMOS devices in a corresponding CMOS area can be performed. After forming the gate dielectric layers 226b, the gate electrode sidewall spacers 226a (e.g., doped polysilicon gate electrode portions) can be formed, as well as polysilicon gate electrodes for corresponding CMOS devices can be formed using appropriate processing operations. After formation of the gate dielectric layers 226b (and CMOS gate electrodes) the example process can include masking the trench-gate FET 200 and performing processing operations (e.g., masking and implant operations) to form p-type wells, n-type wells and lightly-doped (e.g., both p-type and n-type) drain (LDD) regions in a corresponding CMOS device region.

After formation of wells and LDD regions in a CMOS device area, the trench-gate FET 200 can be unmasked and sidewall spacers 810 (e.g., low temperature oxide spacers) can be formed in the trenches of the trenches 415 of the trench-gate FET 200 (e.g., in the active region 110 and the gate contact region 120). Sidewall spacers can also be formed on sidewalls to the gate (polysilicon) electrodes in the CMOS device area.

Figure 9:
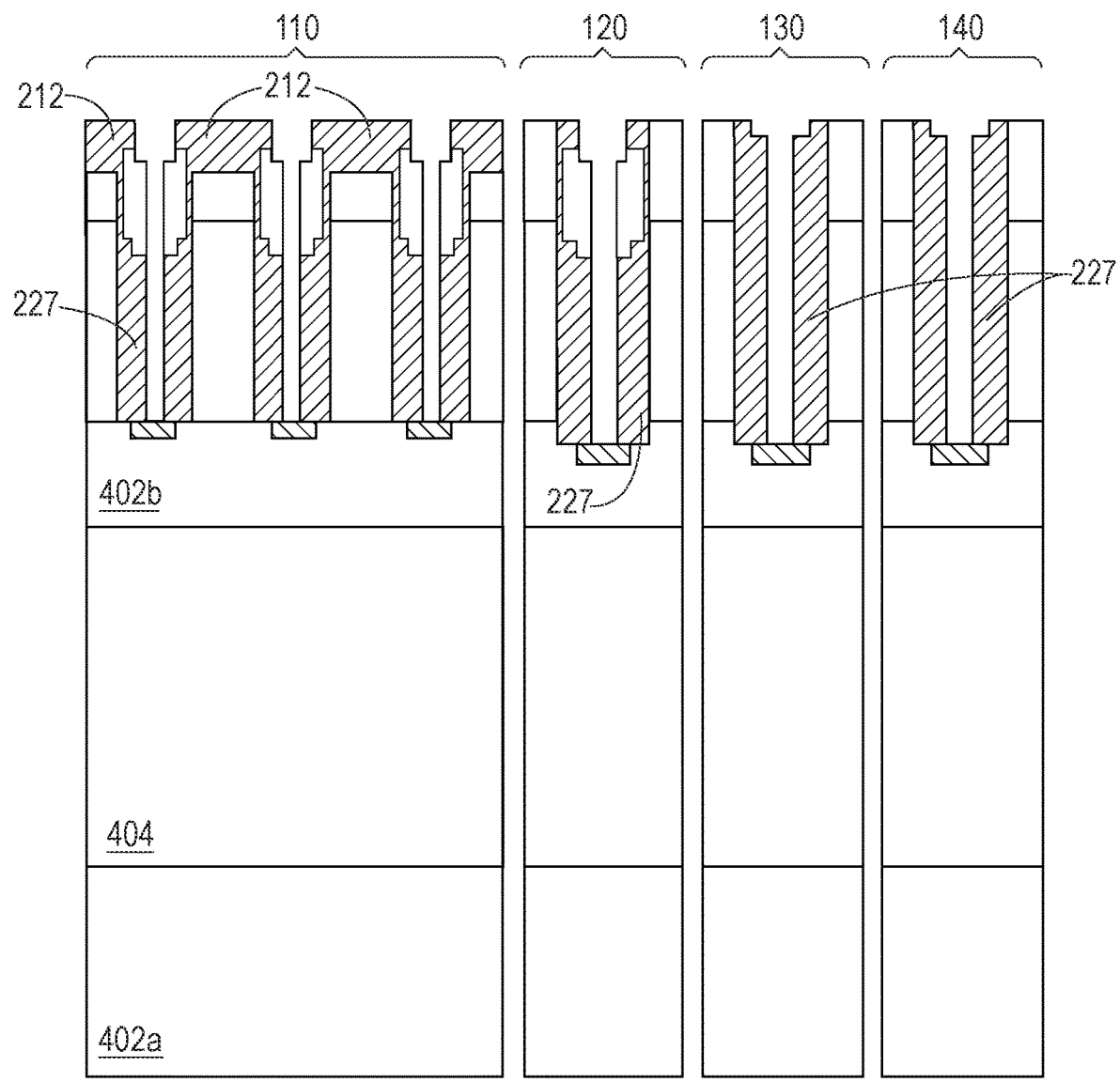

Referring to FIG. 9, in this example, after the processing steps noted above, the (n-type) source regions 212 can be formed in the active region 110 and the gate contact region 120 of the trench-gate FET 200. Further n-type and p-type source and drain regions can be formed for CMOS devices in a CMOS device region (e.g., appropriately masking the trench-gate FET 200). As further shown by FIG. 9, an etch process (e.g., a SiN wet etch) can then be performed to remove the SiN cores 610 from the trenches of the trench-gate FET 200.

Figure 10:
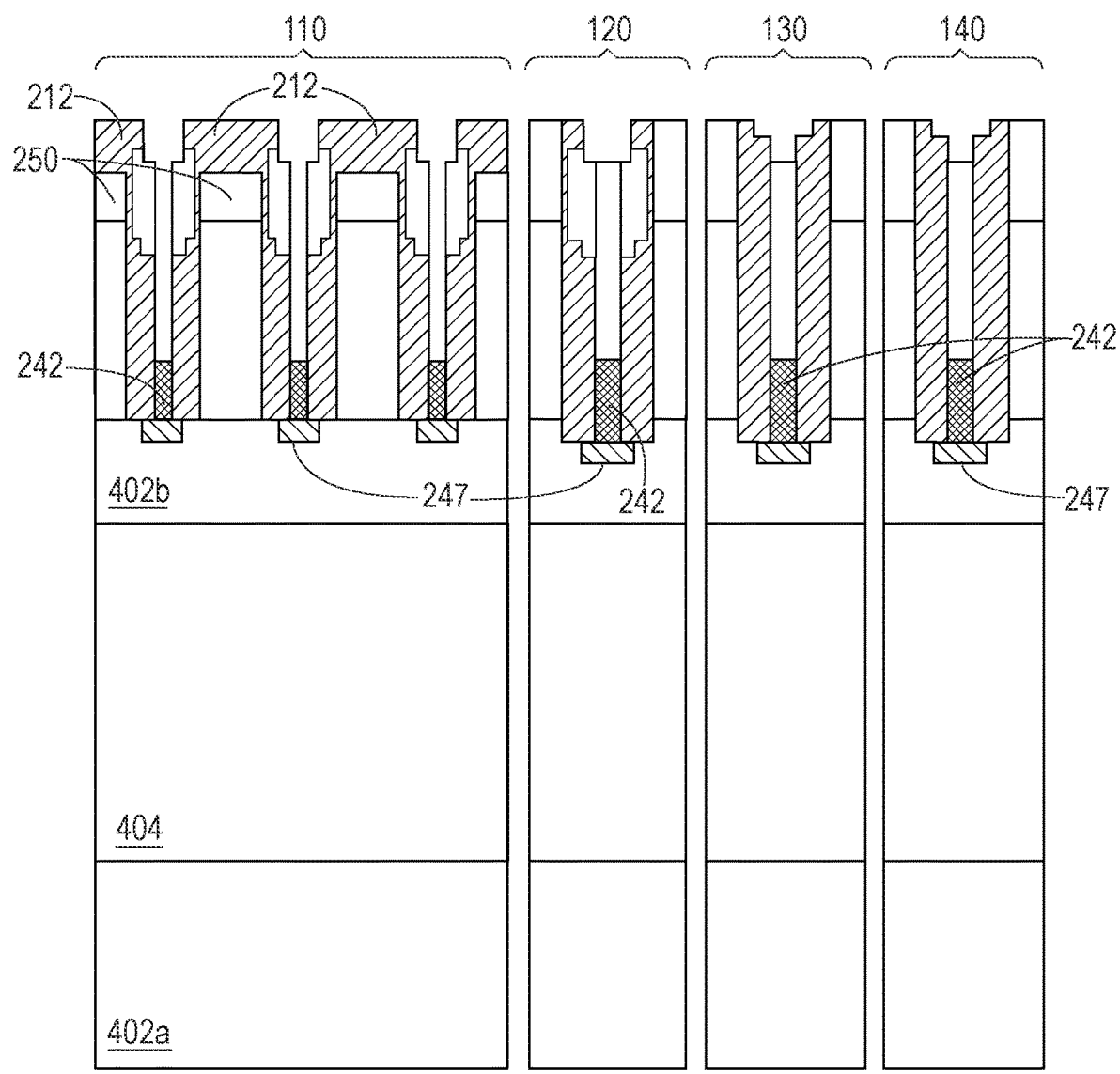

Referring to FIG. 10, after removing the SiN cores 610, a deposition (e.g., sputter, etc.) operation can be performed to form the conductive drain runner 242 in a bottom portion of the trenches of the trench-gate FET 200 in the active region 110, the gate contact region 120, the isolation region 130 and the drain contact region 140. In some implementations, forming the conductive drain runner 242 can include performing a metal (e.g., cobalt, titanium, etc.) sputter operations and a corresponding etch back operation to recess the deposited (metal) material of the of the conductive drain runner 242 in the trenches as shown in FIG. 10. In some implementations, the conductive drain runner 242 can be implemented using a tungsten plug.

Figure 11:
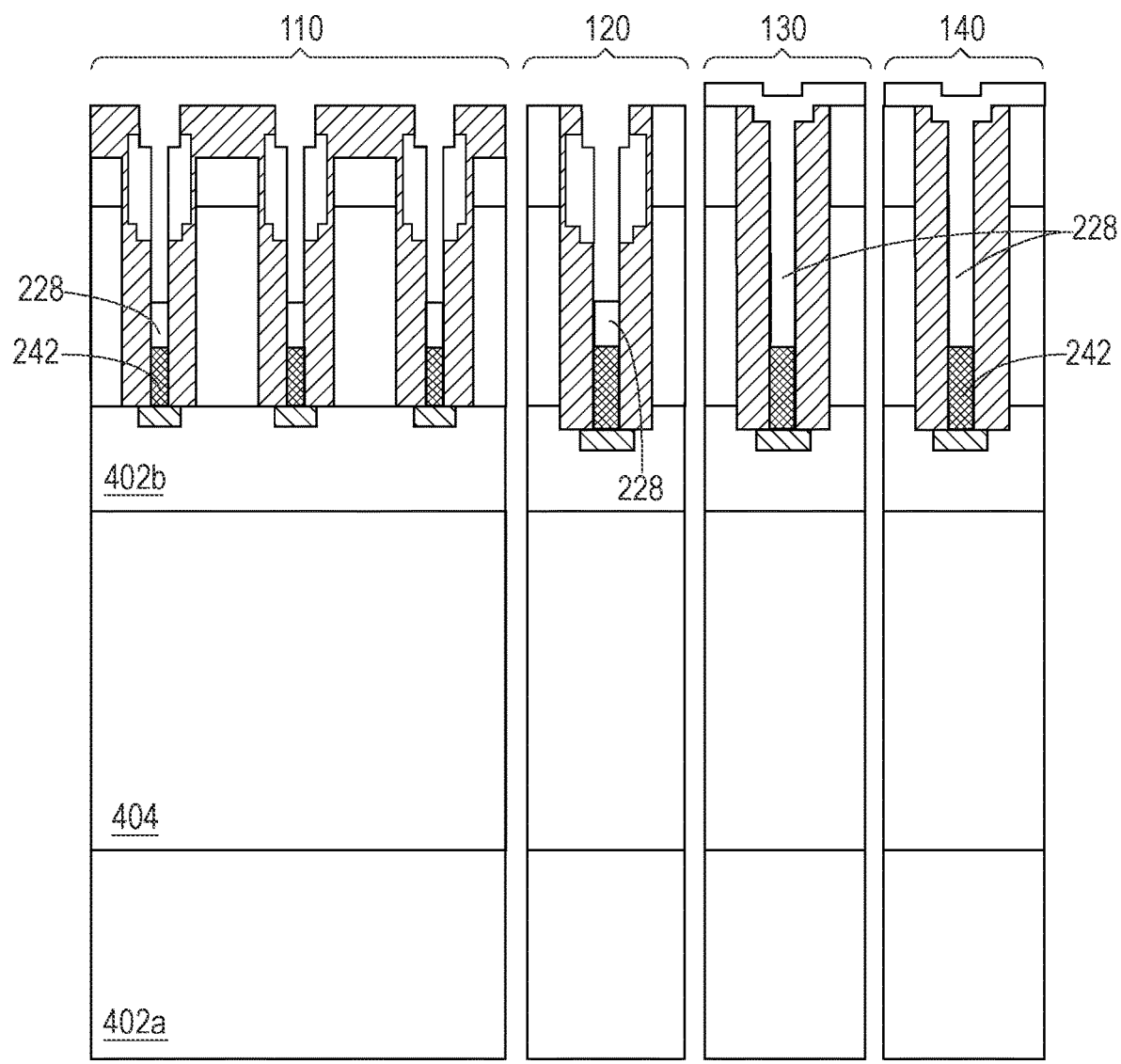

Referring to FIG. 11, after forming the conductive drain runner 242, the example processing can include forming the insulating layer 228 in the trenches of the trench-gate FET 200. As also shown in FIG. 11, etch back operations can be performed to recess the insulating layer 228 in the trenches in the active region 110 and the gate contact region 120 of the trench-gate FET 200. As also shown in FIG. 11, the insulating layer 228 may not be etched back in the trenches of the trench-gate FET 200 in the isolation region 130 and the drain contact region 140. In this example, the insulating layer 228 in isolation region 130 can, as discussed herein, insulate the gate contacts 224 from respective drain contacts 244 (e.g., in a same trench). In some implementations, the insulating layer 228 can include SiN, or other dielectric (electrically insulative) material. Further, the drain contact 244 can be formed through the insulating layer 228 in the drain contact region 140.

Figure 12:
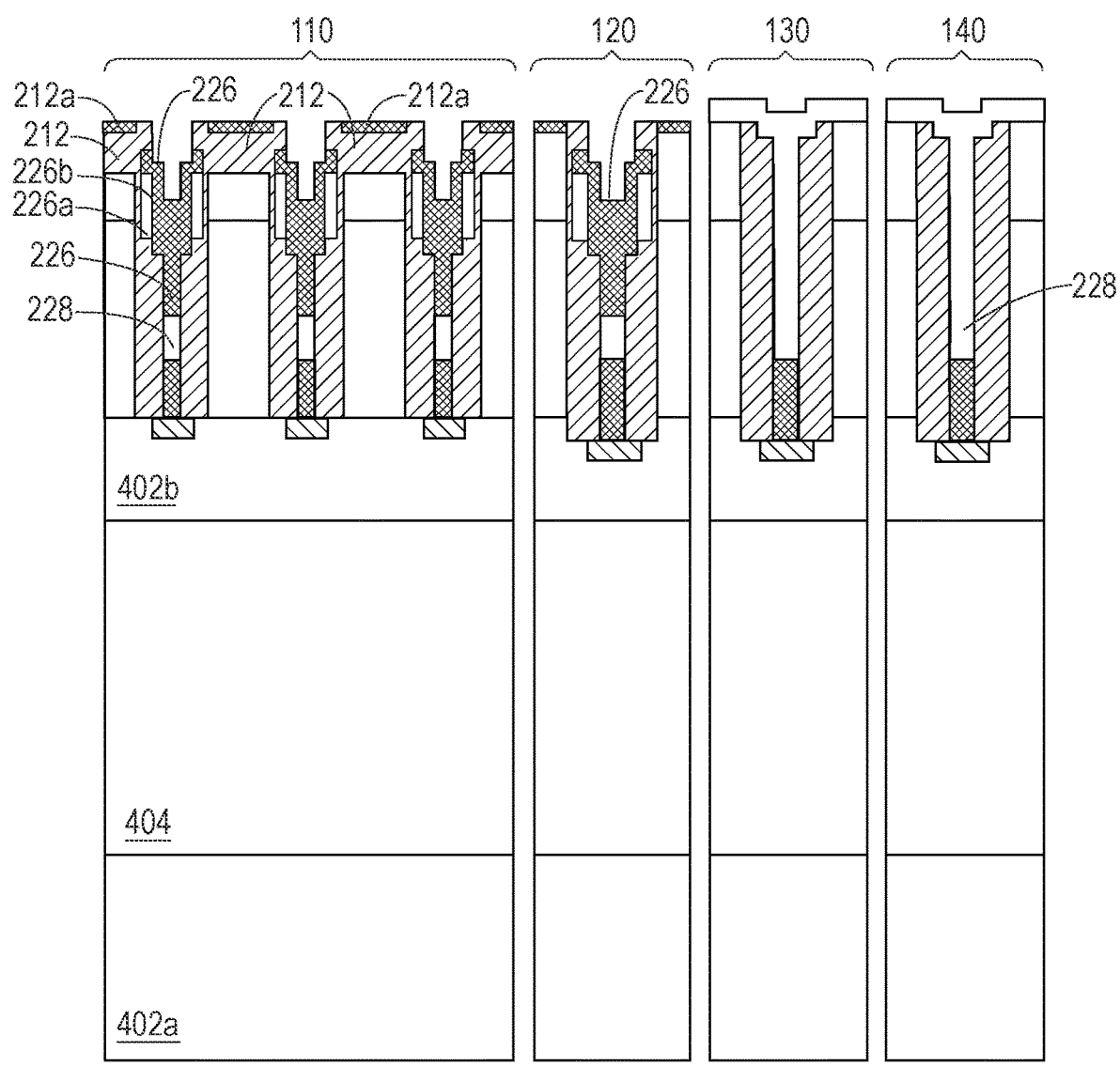

Referring to FIG. 12, after formation of the insulating layer 228, the example process can include forming silicide and/or self-aligned silicide (salicide) on various portions of the trench-gate FET 200 and CMOS devices of a corresponding CMOS device region. In this example, metal-silicide 212a can be formed on the source regions 212 of the trench-gate FET 200, and salicide 226d can be formed on the gate electrode sidewall spacers 226a of the trench-gate FET 200. Also in this example, silicide and/or salicide can be formed on source regions, drain regions and polysilicon gate electrodes of corresponding CMOS devices. As also shown in FIG. 12, the trench-gate electrodes 226 (e.g., metal trench-gate electrodes) can be formed in the trenches of the trench-gate FET 200 in the active region 110 and the gate contact region 120.

Figure 13:
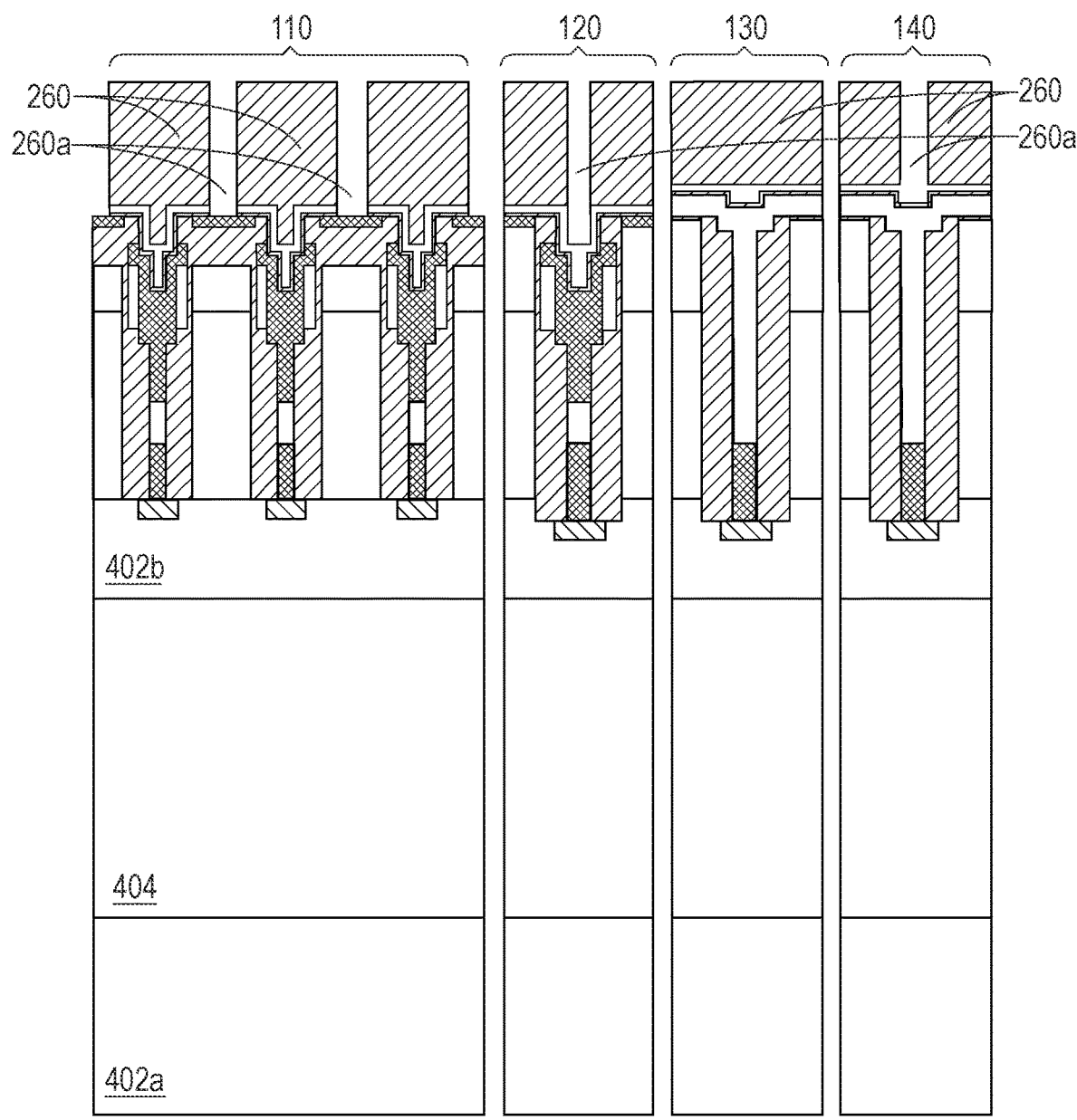

Referring to FIG. 13, in this example process, the CESL 216 and the dielectric 260 (e.g., as discussed with respect to FIG. 3) can be formed on the trench-gate FET 200 as shown in FIG. 12, as well as on corresponding CMOS devices and contact openings 260a can be formed through the CESL 216 and the dielectric 260 (using photomasking and etch operations), as is shown in FIG. 13. For instance, contact openings 260a can be formed for the source/body contacts 214 in the active region 110, for the gate contacts 224 in the gate contact region 120, and for the drain contact 244 in the drain contact region 140. In some implementations, forming the dielectric 260 can also include planarizing (e.g., polishing) the dielectric 260.

Figure 14:
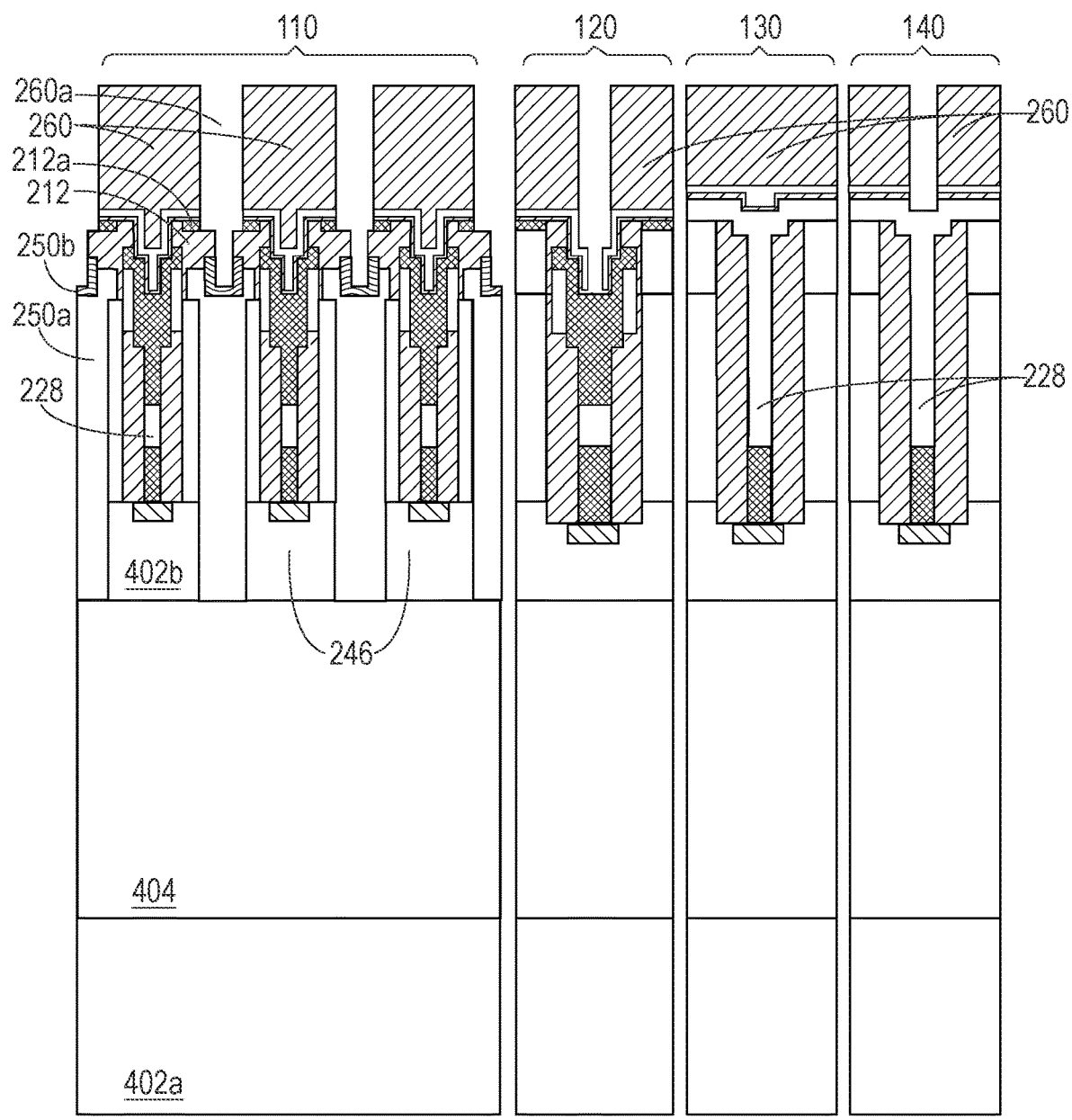

As shown in FIG. 14, after formation of the contact openings 260a, masking and implant operations can be performed to define the p-type pillars 250a and the heavily doped body implants 250b in the active region 110. As shown in FIG. 14, formation of the p-type pillars 250a can also define the lightly-doped drain regions 246 in the n-type well region 402b.

Figure 15:
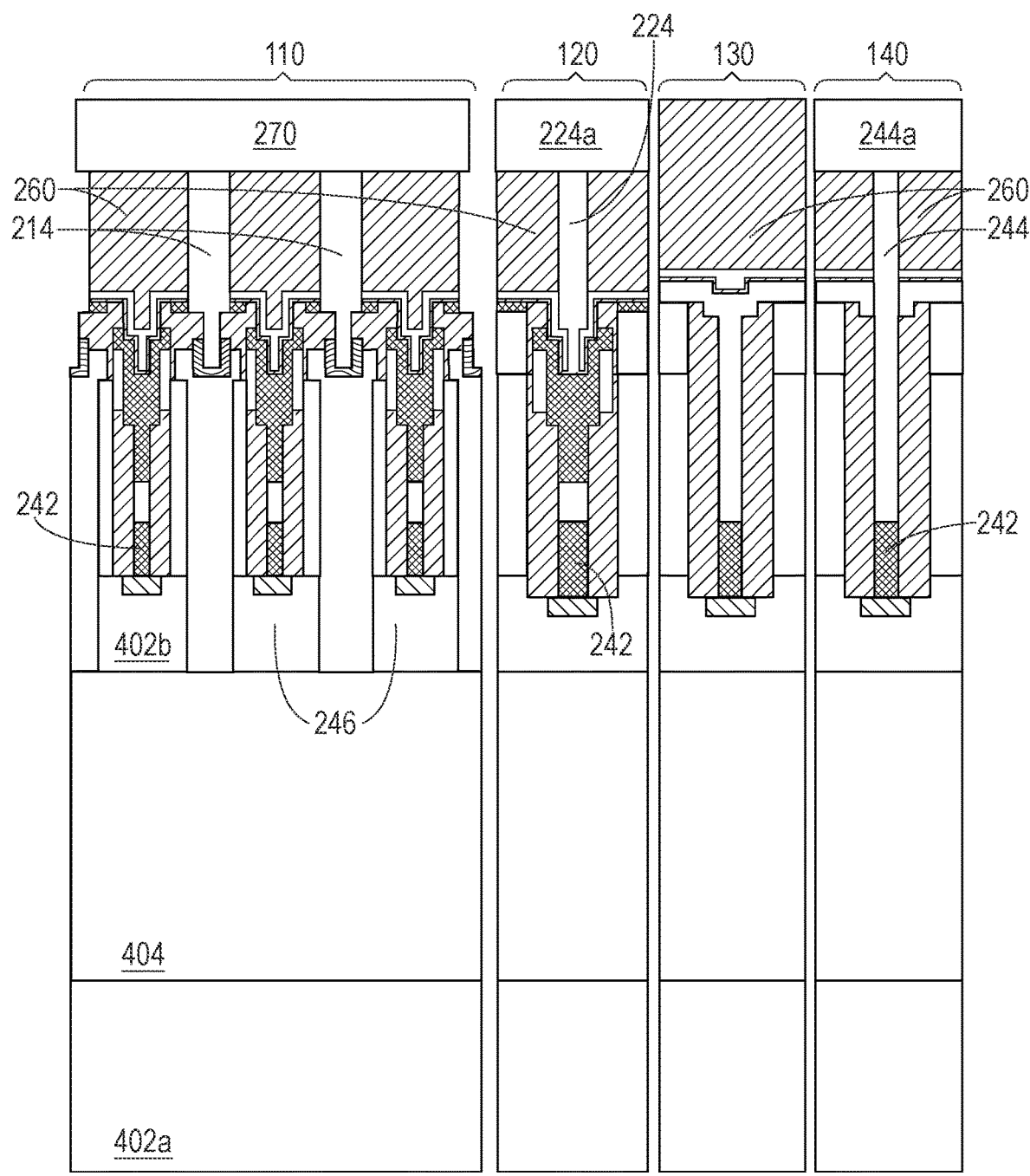

Referring now to FIG. 15, the insulating layer 228 can be removed in the drain contact region 140 to form an opening for formation of the drain contact 244. As noted above, the drain contact 244 can, in some implementation, be implemented in other ways, such as using a heavily doped (n-type) sinker, as one example. In this example, the source/body contacts 214 in the active region 110, the gate contacts 224 in the gate contact region 120, and the drain contacts 244 in the drain contact region 140 can be implemented using respective tungsten plugs with an appropriate barrier metal (to prevent metal migration), or using other conductive material(s). Contacts can also be formed for corresponding CMOS devices. As also shown in FIG. 15, after forming the contact, metallization can be formed to provide electrical connections the trench-gate FET 200 and any corresponding CMOS devices. In this example, as shown in FIG. 15, source/body signal metal layer 270 can be formed in the active region 110, gate signal metal 224a can be formed in the gate contact region 120, and drain signal metal 244a can be formed in the drain contact region 140.

In a general aspect, a field-effect transistor (FET) can include a semiconductor region, and a trench disposed in the semiconductor region. The FET can also include a trench gate disposed in an upper portion of the trench in an active region of the FET. The FET can further include a conductive runner disposed in a bottom portion of the trench. The conductive runner can be electrically coupled with a drain terminal of the FET. A portion of the conductive runner can be disposed in the active region below the trench gate.

Implementations can include one or more of the following features. For example, the conductive runner can includes at least one of a metal, or a metal-silicide.

The FET can include an electrical contact to the conductive runner. The electrical contact to the conductive runner can extend, in the trench, from a surface of the semiconductor region to the conductive runner. The FET can include an electrical contact to the trench gate, the electrical contact to the trench gate can extend, in the trench, from a surface of the semiconductor region to the trench gate. The FET can include an electrically insulative material disposed on the conductive runner. The electrically insulative material can electrically insulate the electrical contact to the conductive runner from the electrical contact to the trench gate. In the trench, in the active region, the electrically insulative material can be disposed between the trench gate and the conductive runner.

The trench gate can include a gate dielectric disposed on a sidewall of the upper portion of the trench, a polysilicon spacer disposed on the gate dielectric, and/or a metal gate electrode disposed on the polysilicon spacer.

The FET can include a shield dielectric disposed in the trench, the conductive runner being disposed in the shield dielectric.

The semiconductor region can be a well region of a first conductivity type. The FET further can include a first buried well region of a second conductivity type, opposite the first conductivity type. The well region can be disposed on the first buried well region of the second conductivity type. The FET can further include a second buried well region of the first conductivity type. The first buried well region can be disposed on the second buried well region.

In another general aspect, a FET can include a semiconductor region, an active region, a gate contact region, an isolation region, and a drain contact region. The active region can be disposed in the semiconductor region. The gate contact region can be disposed in the semiconductor region and adjacent to the active region. The isolation region can be disposed in the semiconductor region and adjacent to the isolation region, the gate contact region being disposed between the active region and the isolation region. The drain contact region can be disposed in the semiconductor region and adjacent to the isolation region, the isolation region being disposed between the gate contact region and the drain contact region. The FET can further include a trench disposed in the semiconductor region, and a conductive runner disposed in a bottom portion of the trench. The conductive runner can extend from the active region to the drain contact region, and be electrically coupled with a drain terminal of the FET.

Implementations can include one or more of the following features. For example, the conductive runner can include at least one of a metal, or a metal-silicide.

The semiconductor region can be a well region of a first conductivity type. The FET can include a buried well region of a second conductivity type, opposite the first conductivity type. The well region of the first conductivity type can be disposed on the buried well region of the second conductivity type. The buried well region can be a first buried well region. The FET can include a second buried well region of the first conductivity type. The first buried well region can be disposed on the second buried well region.

The FET can include a drain implant disposed in the semiconductor region below the trench. The drain implant can be electrically coupled with the conductive runner and extend from the active region to the drain contact region.

The FET can include, in the drain contact region, an electrical contact to the conductive runner. The electrical contact can extend, in the trench, from a surface of the semiconductor region to the conductive runner.

The FET can include a trench gate extending from the gate contact region to the active region. The trench gate can be disposed in an upper portion of the trench. The trench gate can include a gate dielectric disposed on a sidewall of the upper portion of the trench, a polysilicon spacer disposed on the gate dielectric, and a metal gate electrode disposed on the polysilicon spacer. The FET can include, in the active region and the gate contact region, an insulating layer disposed between the metal gate electrode and the conductive runner. The sidewall of the trench can be a first sidewall of the trench. The trench can include a second sidewall opposite the first sidewall. The FET can include, in the active region, a shield dielectric disposed on respective lower portions of the first sidewall and the second sidewall. The conductive runner, the insulating layer, and a portion of metal gate electrode can be, in the active region, disposed within the shield dielectric.

The FET can include, in the drain contact region, an electrical contact to the conductive runner. The electrical contact to the conductive runner can extend, in the trench, from a surface of the semiconductor region to the conductive runner. The FET can include, in the gate contact region, an electrical contact to a trench gate. The electrical contact to the trench gate can extend, in the trench, from a surface of the semiconductor region to the trench gate. The FET can include, in the isolation region, an electrically insulative material disposed on the conductive runner. The electrically insulative material can electrically insulate the electrical contact to the conductive runner from the electrical contact to the trench gate.

In another general aspect, a method for producing a field-effect transistor (FET) can include forming a trench in a semiconductor region, and forming a conductive runner in a bottom portion of the trench. The conductive runner can be electrically coupled with a drain terminal of the FET. The method can further include forming a trench gate in an upper portion of the trench in an active region of the FET. A portion of the conductive runner can be disposed in the active region below the trench gate.

Implementations can include one or more of the following features. For example, the method can include forming an electrically insulative material disposed on the conductive runner, and forming a first electrical contact to the conductive runner. The first electrical contact can extend, in the trench, from a surface of the semiconductor region to the conductive runner. The method can include forming a second electrical contact to the trench gate. The second electrical contact can extend, in the trench, from a surface of the semiconductor region to the trench gate. The electrically insulative material can electrically insulate the first electrical contact from the second electrical contact.

The method can include, prior to forming the conductive runner, forming a drain implant in the semiconductor region below the trench, the conductive runner being electrically coupled with the drain implant.

It will be understood, for purposes of this disclosure, that when an element, such as a layer, a region, or a substrate, is referred to as being on, disposed on, connected to, electrically connected to, coupled to, or electrically coupled to another element, it may be directly on, connected or coupled to the other element, or one or more intervening elements may be present. In contrast, when an element is referred to as being directly on, directly disposed on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to, or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), gallium arsenide (GaAs), gallium nitride (GaN), silicon carbide (SiC), and/or so forth.

While certain features of various example implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A field-effect transistor (FET) comprising:
a semiconductor region;
a trench disposed in the semiconductor region;
a trench gate disposed in an upper portion of the trench in an active region of the FET;
a conductive runner disposed in a bottom portion of the trench, the conductive runner being electrically coupled with a drain terminal of the FET via an ohmic contact with a heavily doped implant, a portion of the conductive runner being disposed in the active region below the trench gate; and
a dielectric layer disposed in the trench between trench gate and the conductive runner.

2. The FET of claim 1, wherein the conductive runner includes at least one of:
a metal; or
a metal-silicide.

3. The FET of claim 1, further comprising:
a first electrical contact to the conductive runner, the first electrical contact extending, in the trench, from a surface of the semiconductor region to the conductive runner;
a second electrical contact to the trench gate, the second electrical contact extending, in the trench, from the surface of the semiconductor region to the trench gate; and
an electrically insulative material disposed on the conductive runner, the electrically insulative material electrically insulating the first electrical contact from the second electrical contact.

4. The FET of claim 3, wherein, in the trench in the active region, the electrically insulative material is disposed between the trench gate and the conductive runner.

5. The FET of claim 1, wherein the trench gate includes:
a gate dielectric disposed on a sidewall of the upper portion of the trench;
a polysilicon spacer disposed on the gate dielectric; and
a metal gate electrode disposed on the polysilicon spacer.

6. The FET of claim 1, further comprising:
a shield dielectric disposed in the trench, the conductive runner being disposed in the shield dielectric.

7. The FET of claim 1, wherein the semiconductor region is a well region of a first conductivity type,
the FET further comprising:
a first buried well region of a second conductivity type, opposite the first conductivity type, the well region being disposed on the first buried well region of the second conductivity type; and
a second buried well region of the first conductivity type, the first buried well region being disposed on the second buried well region.

8. A field-effect transistor (FET) comprising:
a semiconductor region;
an active region disposed in the semiconductor region;
a gate contact region disposed in the semiconductor region and adjacent to the active region;
an isolation region disposed in the semiconductor region and adjacent to the gate contact region, the gate contact region being disposed between the active region and the isolation region;
a drain contact region disposed in the semiconductor region and adjacent to the isolation region, the isolation region being disposed between the gate contact region and the drain contact region;
a trench disposed in the semiconductor region;
a trench gate disposed in an upper portion of the trench in an active region of the FET;
a conductive runner disposed in a bottom portion of the trench, the conductive runner extending from the active region to the drain contact region, the conductive runner being electrically coupled with a drain terminal of the FET via an ohmic contact with a heavily doped implant; and
dielectric layer disposed in the trench between the trench gate and the conductive runner.

9. The FET of claim 8, wherein the conductive runner includes at least one of:
a metal; or
a metal-silicide.

10. The FET of claim 8, wherein the semiconductor region is a well region of a first conductivity type,
the FET further comprising a buried well region of a second conductivity type, opposite the first conductivity type, the well region of the first conductivity type being disposed on the buried well region of the second conductivity type.

11. The FET of claim 10, wherein the buried well region is a first buried well region,
the FET further comprising a second buried well region of the first conductivity type, the first buried well region being disposed on the second buried well region.

12. The FET of claim 8, wherein the heavily doped implant is disposed in the semiconductor region below the trench, the heavily doped implant is electrically coupled with the conductive runner and extending from the active region to the drain contact region.

13. The FET of claim 8, further comprising, in the drain contact region, an electrical contact to the conductive runner, the electrical contact extending, in the trench, from a surface of the semiconductor region to the conductive runner.

14. The FET of claim 8, further comprising a trench gate extending from the gate contact region to the active region, the trench gate being disposed in an upper portion of the trench, the trench gate including:
a gate dielectric disposed on a sidewall of the upper portion of the trench;
a polysilicon spacer disposed on the gate dielectric; and
a metal gate electrode disposed on the polysilicon spacer.

15. The FET of claim 14, further comprising, in the active region and the gate contact region, an insulating layer disposed between the metal gate electrode and the conductive runner.

16. The FET of claim 15, wherein the sidewall of the trench is a first sidewall of the trench, the trench including a second sidewall opposite the first sidewall, the FET further comprising, in the active region:
a shield dielectric disposed on respective lower portions of the first sidewall and the second sidewall, the conductive runner, the insulating layer, and a portion of metal gate electrode being, in the active region, disposed within the shield dielectric.

17. The FET of claim 8, further comprising:

in the drain contact region, a first electrical contact to the conductive runner, the first electrical contact extending, in the trench, from a surface of the semiconductor region to the conductive runner;

in the gate contact region, a second electrical contact to a trench gate, the second electrical contact extending, in the trench, from the surface of the semiconductor region to the trench gate; and in the isolation region, an electrically insulative material disposed on the conductive runner, the electrically insulative material electrically insulating the first electrical contact from the second electrical contact.

18. A method for producing a field-effect transistor (FET) comprising:

forming a trench in a semiconductor region;

forming a conductive runner in a bottom portion of the trench, the conductive runner being electrically coupled with a drain terminal of the FET via an ohmic contact with a heavily doped implant;

forming a dielectric layer disposed on the conductive runner in the trench; and forming a trench gate in an upper portion of the trench in an active region of the FET, the trench gate being disposed on the dielectric layer, the dielectric layer being disposed between the conductive runner and the trench gate, and a portion of the conductive runner being disposed in the active region below the trench gate.

19. The method of claim 18, further comprising:

forming an electrically insulative material disposed on the conductive runner;

forming a first electrical contact to the conductive runner, the first electrical contact extending, in the trench, from a surface of the semiconductor region to the conductive runner; and forming a second electrical contact to the trench gate, the second electrical contact extending, in the trench, from the surface of the semiconductor region to the trench gate, the electrically insulative material electrically insulating the first electrical contact from the second electrical contact.

20. The method of claim 18, further comprising, prior to forming the conductive runner:

forming a drain implant in the semiconductor region below the trench, the conductive runner being electrically coupled with the drain implant.

* * * * *